United States Patent
Cohn et al.

(10) Patent No.: US 7,536,664 B2
(45) Date of Patent: May 19, 2009

(54) PHYSICAL DESIGN SYSTEM AND METHOD

(75) Inventors: John M. Cohn, Richmond, VT (US);
James A. Culp, Downington, PA (US);
Ulrich A. Finkler, Mahopac, NY (US);
Fook-Luen Heng, Yorktown Heights, NY (US); Mark A. Lavin, Katonah, NY (US); Jin Fuw Lee, Yorktown Heights, NY (US); Lars W. Liebmann, Poughquag, NY (US); Gregory A. Northrop, Putnam Valley, NY (US); Nakgeuon Seong, Wappingers Falls, NY (US); Rama N. Singh, Bethel, CT (US); Leon Stok, Croton on Hudson, NY (US); Pieter J. Woltgens, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 646 days.

(21) Appl. No.: 10/917,193

(22) Filed: Aug. 12, 2004

(65) Prior Publication Data
US 2006/0036977 A1 Feb. 16, 2006

(51) Int. Cl.
G06F 17/50 (2006.01)
G06F 19/00 (2006.01)

(52) U.S. Cl. .............................. 716/10; 716/9; 716/18; 716/21

(58) Field of Classification Search .................. 716/10, 716/9, 18, 21
See application file for complete search history.

(56) References Cited

U.S. PATENT DOCUMENTS

| | | | | |
|---|---|---|---|---|
| 4,789,944 A * | 12/1988 | Wada et al. ................... 716/11 |
| 5,287,290 A * | 2/1994 | Tabara et al. .................... 716/5 |
| 5,652,874 A * | 7/1997 | Upson et al. ................... 716/11 |
| 5,689,433 A * | 11/1997 | Edwards ......................... 716/2 |
| 5,754,826 A * | 5/1998 | Gamal et al. .................. 703/14 |
| 5,946,476 A * | 8/1999 | Tomoda ......................... 716/9 |
| 6,077,310 A * | 6/2000 | Yamamoto et al. ............ 716/19 |
| 6,099,581 A * | 8/2000 | Sakai ........................... 716/11 |
| 6,240,541 B1 | 5/2001 | Yasuda et al. |
| 6,442,740 B1 * | 8/2002 | Kanamoto et al. ............. 716/6 |
| 6,460,166 B1 * | 10/2002 | Reddy et al. .................... 716/2 |
| 6,574,779 B2 * | 6/2003 | Allen et al. ..................... 716/1 |
| 6,792,593 B2 * | 9/2004 | Takashima et al. ............ 716/21 |
| 6,869,739 B1 * | 3/2005 | Ausschnitt et al. ............ 430/30 |
| 6,952,811 B1 * | 10/2005 | Iwata et al. ..................... 716/4 |
| 6,961,920 B2 * | 11/2005 | Zach ............................ 716/21 |
| 7,047,511 B2 * | 5/2006 | Moyer ............................ 716/8 |
| 7,075,532 B2 * | 7/2006 | Mukherjee et al. .......... 345/423 |

(Continued)

*Primary Examiner*—Phallaka Kik
(74) *Attorney, Agent, or Firm*—Law Office of Charles W. Peterson, Jr.; Louis J. Percello, Esq.; Brian P. Verminski, Esq.

(57) ABSTRACT

A design system for designing complex integrated circuits (ICs), a method of IC design and program product therefor. A layout unit receives a circuit description representing portions in a grid and glyph format. A checking unit checks grid and glyph portions of the design. An elaboration unit generates a target layout from the checked design. A data prep unit prepares the target layout for mask making. A pattern caching unit selectively replaces portions of the design with previously cached results for improved design efficiency.

18 Claims, 8 Drawing Sheets

U.S. PATENT DOCUMENTS

| | | | | |
|---|---|---|---|---|
| 2001/0004762 A1* | 6/2001 | Matsumoto et al. | ............ | 716/1 |
| 2001/0005566 A1* | 6/2001 | Kotani et al. | ............ | 430/5 |
| 2002/0166104 A1* | 11/2002 | Wu et al. | ............ | 716/12 |
| 2002/0194575 A1* | 12/2002 | Allen et al. | ............ | 716/17 |
| 2003/0005390 A1* | 1/2003 | Takashima et al. | ............ | 716/1 |
| 2003/0182648 A1* | 9/2003 | Ushiyama et al. | ............ | 716/10 |
| 2004/0158805 A1* | 8/2004 | Kanamoto et al. | ............ | 716/11 |
| 2004/0172611 A1* | 9/2004 | Pang | ............ | 716/19 |
| 2004/0199886 A1* | 10/2004 | Liang et al. | ............ | 716/5 |
| 2005/0060680 A1* | 3/2005 | Croke et al. | ............ | 716/19 |
| 2005/0071796 A1* | 3/2005 | Moyer | ............ | 716/12 |
| 2005/0138584 A1* | 6/2005 | Beattie et al. | ............ | 716/5 |
| 2005/0138596 A1* | 6/2005 | Medvedeva et al. | ............ | 716/19 |
| 2005/0188338 A1* | 8/2005 | Kroyan et al. | ............ | 716/9 |
| 2005/0229130 A1* | 10/2005 | Wu et al. | ............ | 716/8 |
| 2005/0268256 A1* | 12/2005 | Tsai et al. | ............ | 716/4 |
| 2005/0278685 A1* | 12/2005 | Granik et al. | ............ | 716/19 |
| 2005/0283747 A1* | 12/2005 | Adam | ............ | 716/4 |
| 2006/0031809 A1* | 2/2006 | Zach | ............ | 716/19 |

* cited by examiner

PHYSICAL DESIGN SYSTEM AND METHOD

BACKGROUND OF THE INVENTION

1. Field of the Invention

The present invention is related to integrated circuit (IC) and chip design systems and more particularly to computer aided design (CAD) systems for designing ICs and IC chips.

2. Background Description

Semiconductor technology and chip manufacturing advances have resulted in a steady decrease of chip feature size to increase on-chip circuit switching frequency (circuit performance) and the number of transistors (circuit density). Typical semiconductor integrated circuit (IC) chips are multilayered units with circuit layers stacked such that layer features overlay one another to form individual devices and connect devices together. Individual layers normally are patterned lithographically using well known photolithographic techniques as applied to semiconductor manufacturing. Normally, a chip designer creates an electrical or logic representation of a new chip that is converted to a chip/circuit layout. The chip/circuit layout is converted to mask shapes that are printed on photolithographic masks. Each photolithographic mask is used to print a pattern on a semiconductor wafer, which may define local wafer properties or one of the chip/circuit layers.

Previously, both design and manufacturing have operated on the assumption that the geometries of the designed layout and manufactured wafer, as well as those of the photomasks used to transfer the design geometries to the wafer, closely resemble each other. As semiconductor technology has pushed the limit of physical processes and materials, this assumption is no longer valid. As a result, increasing creativity, effort and expense has been necessary for design, lithographic patterning and manipulating the design data flow to manufacturing. In some cases, manufacturing costs and risks have made state of the art layout methodology and supporting computer-aided design tools inadequate for producing manufacturable designs, i.e., fabricated wafers that exactly satisfy the properties intended/assumed/modeled in the design.

Thus, there is a need for design tools that reduce the cost and risk of layout generation and layout checking, and that improves the efficiency of layout data preparation. In particular, there is a need for design tools that improve design manufacturability, i.e., providing designs for which the fabricated wafers will more exactly satisfy the properties intended/assumed/modeled in the design phase, at lower manufacturing cost and risk.

SUMMARY OF THE INVENTION

It is a purpose of the invention to simplify circuit physical design;

It is yet another purpose of the invention to reduce the cost and risk of layout generation and layout checking;

It is yet another purpose of the invention to improve the efficiency of layout data preparation;

It is yet another purpose of the invention to achieve the design goals, matching the final fabricated wafer more exactly to the intended/assumed/modeled design properties and at lower manufacturing cost and risk.

The present invention relates to a design system for designing complex integrated circuits (ICs), a method of IC design and program product therefor. A layout unit receives a circuit description representing portions in a grid and glyph format. A checking unit checks grid and glyph portions of the design. An elaboration unit generates a target layout from the checked design. A data prep unit prepares the target layout for mask making. A pattern caching unit selectively replaces portions of the design with previously cached results for improved design storage efficiency.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
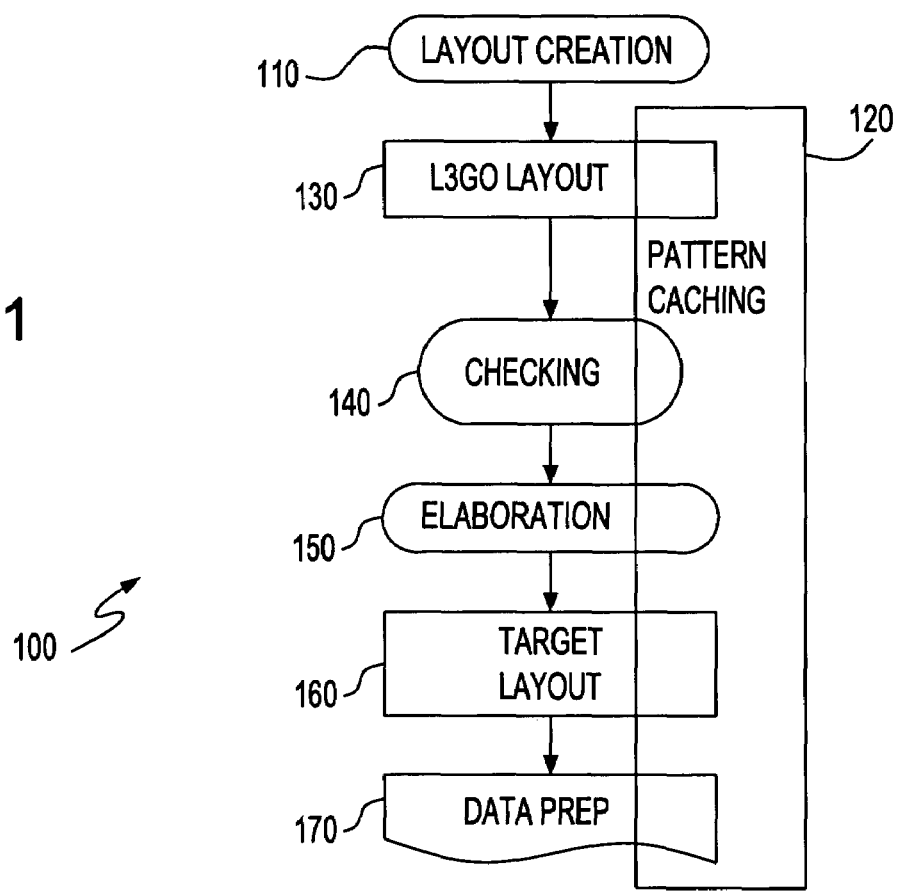
FIG. 1 shows a simple example of an integrated circuit (IC) chip, process neutral, physical design flow according to a preferred embodiment of the present invention.

Turning now to the drawings and, more particularly, FIG. 1 shows a simple example of an integrated circuit (IC) chip, process neutral, physical design flow 100 according to a preferred embodiment of the present invention. A typical state of the art circuit design is provided for physical design 110, primarily in a process neutral grid and glyph representation format. A pattern caching unit 120 monitors and analyzes the process neutral chip physical design flow 100 for optimum handling and workload reduction as the particular grid and glyph representation or layout 130 from physical design 110 traverses the flow. A preferred layout 130 is in a format referred to herein as a layout using gridded glyph geometric objects (L3GO) and referred to a L3GO layout. A L3GO layout 130 is, essentially, an extension to a conventional design. Conventional physical design layouts are organized in cells, layers, transforms and represented solely by polygonal shapes with coordinates in database units (DBU(s)), typically much smaller than the minimum manufacturable feature (e.g., 1 nm) for precise shape and position specification. However, a L3GO layout is much simpler and on a much more coarse grid with few optional conventional shapes, but primarily L3GO-specific components, i.e., grids, glyphs and attributes.

The completed L3GO layout 130 from physical design 110 is checked in checking unit 140 for L3GO specific rule violations as well as other typical physical design rule violations. After checking, the checked L3GO layout passes to an elaboration unit 150, which expands the grid and glyph design to conventional layout shapes for the particular selected technology to produce a target layout 160. The target layout passes to data preparation, e.g. in a data prep unit 170, which preprocesses the design shapes using typical integrated circuit (IC) design mask making data preparation techniques, e.g., resolution enhancement techniques (RETs) and optical proximity correction (OPC).

Again, pattern caching 120 monitors for previously encountered patterns at each of the units or combination of units and substitutes previously computed cached results for previously encountered patterns, wherever possible to reduce overall workload. In particular, pattern caching 120 leverages pattern repetition within a design to reduce the overall as well as individual unit computation required for a particular L3GO layout and also, reduces the data needed to represent the output. In a large design in particular, the L3GO constraints increase the likelihood that many local areas of the design are identical, above and beyond inherent repetition of nested hierarchical design structures. Typically, the physical design is partially flattened to address any hierarchical repetition using one of a number of existing techniques, e.g., U.S. Pat. No. 5,519,628, entitled System and Method for Formulating Subsets of a hierarchical Circuit" to Russell et al., issued May 21, 1996. The flattened design has a number of collections of glyphs on one or more layers that are partitioned into a set of sub-glyphs. Glyphs may be partitioned into sub-glyphs, e.g., based on the interaction of glyphs or parts of glyphs at a distance up to the radius of interaction (ROI) of the computation to be performed. Typically for OPC, for example, the ROI is two to three times the optical wavelength. A pattern is encoded for each subglyph that includes the configuration of the resulting flattened sub-glyph set in the ROI neighborhood. The computation may be reduced by searching for each current subglyph's pattern in a pattern dictionary that contains previously-processed patterns. If the pattern is not found, then the result for the current subglyph and its surrounding pattern is computed, e.g., using OPC. The new pattern result is stored in the pattern dictionary with the pattern as its key, and the result is added to the overall output. Otherwise, if the pattern is found, the previously-computed result is taken from the pattern dictionary and added to the overall output. Output data volume may be reduced by representing frequently-repeated patterns as cells having multiple instances.

Figure 2:
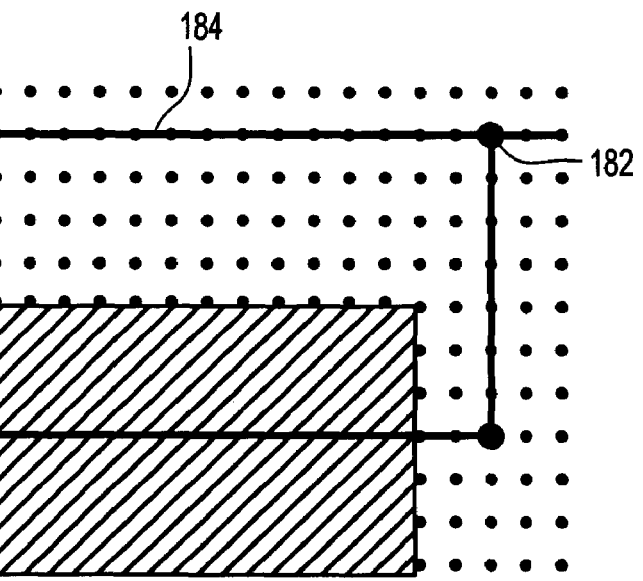
FIG. 2 shows a simple L3GO layout, e.g., from the layout creation.

FIG. 2 shows an example of a simple L3GO layout 180 from the layout creation 110 of FIG. 1. Generally, typical L3GO layouts include primarily three simple geometric types of primitives or glyphs, point glyphs 182 (also referred to herein as points), stick glyphs 184 (also referred to herein as sticks) and rectangle glyphs 186 (also referred to herein as rectangles). The grid is a regular rectangular array of points 188, all of which are subsets of a built-in manufacturing grid. Each glyph is specified with respect to the grid and assigned to a layer. Attributes also may be assigned to each glyph that carry arbitrary additional information including, for example, design intent, e.g., indicating that a polysilicon level glyph is in a timing-critical net. In a typical L3GO layout 130, each grid and glyph occupies a particular cell and layer. Rules for hierarchical glyph replication (e.g., for nesting) follow the usual conventions for shapes.

Point glyphs 182 are dimensionless or 0-dimensional points lying at grid points and are typically used for vertical interconnections, e.g., contacts and vias. Stick glyphs 184 are 1-dimensional line segments drawn between two grid points. Typically, stick glyphs 184 are used for FET gates or for interconnections. Rectangle glyphs 186 are 2-dimensional, axis-aligned rectangles with vertices on grid points, typically used for diffusion regions. As with polygonal shapes in conventional layouts, each L3GO glyph resides on a particular design layer (e.g., POLY, DIFF), which indicates its function, wafer material and etc. Optionally, components not amenable to the grid and glyph restrictions (e.g., memory bit cells and analog devices) may be included in the L3GO layout represented by more conventional polygonal shapes.

The L3GO layout, e.g., 180, is passed to layout checking 140. By restricting layout geometry, specifying and checking layouts is considerably simplified over more conventional design approaches. L3GO layouts may be checked with simple pattern matching, i.e., matching local configurations of glyphs against a pattern library of allowed and disallowed configurations. L3GO patterns are conjunctive and disjunctive combinations of primitive functions (glyph type, orientation and size). Advantageously, pattern matching may use efficient subgraph isomorphism algorithms. Unlike traditional design approaches, design rules need not be defined by complex arbitrary geometric computations that may be based on a large number of primitive functions and composition operators.

The elaboration unit 150 converts L3GO layouts into more conventional layout shapes. At its simplest, the elaboration unit converts: point glyphs 182 into squares of a fixed size, where that size may depend upon design layer for the particular point glyph 182; stick glyphs 184 into rectangles of fixed width and overhang, i.e., with respect to stick glyph start and end grid points; and, rectangle glyphs 186 into rectangles with specified overhang with respect to vertex grid points. Further, the elaboration unit 150 may perform more complex transformations involving single glyphs or glyphs in a specified context. For example, the amount of end-overhang for a stick glyph 184 can be predicated on the proximity to nearby same-layer glyphs, whether the particular stick glyph represents the end of a polysilicon gate or a connecting wire and/or, glyphs on other layers (e.g., diffusions, vias). Further, the glyph-to-conventional shape transformation can include certain design-for-yield actions (DFY) such as the insertion of redundant contacts or vias, and the addition of landing pads around vertical connections.

The target layout 160 from the elaboration unit 150, typically includes shapes that are compatible with state of the art layout design flows, but with additional information from elaboration. This additional information conveys geometric intent and includes tolerances on the variability in geometric parameters, e.g., local line width, local spacing, and corner rounding allowable by downstream processes. This geometric intent information reflects the design intent that is more directly coded in the glyphs as designed. For example, a stick glyph representing a polysilicon gate might be labeled with allowable gate length ($L_{eff}$) variability based on timing or power constraints. In this example, elaboration may convert this into a linewidth variability tolerance that labels the resulting rectangular target shape. Downstream programs (e.g., OPC) may use the geometric intent information to decide precision level used in generating and representing corrections and to make trade-offs between mutually exclusive corrections constrained by mask-making requirements. Some existing OPC programs have provisions for representing and using such tolerance information, albeit indirectly.

Again, it should be noted that pattern caching 120 can be applied to checking 140, during elaboration in elaboration unit 150, to elaboration in combination with RETs and OPC or, to any sequence of functions shown in FIG. 1 as long as the starting input is a L3GO design. So, for example pattern caching can be applied to elaboration in combination with RETs and OPC and further followed by process simulation and extraction for providing electrical parametric models for the original L3GO layout from layout creation 110.

Figure 3:
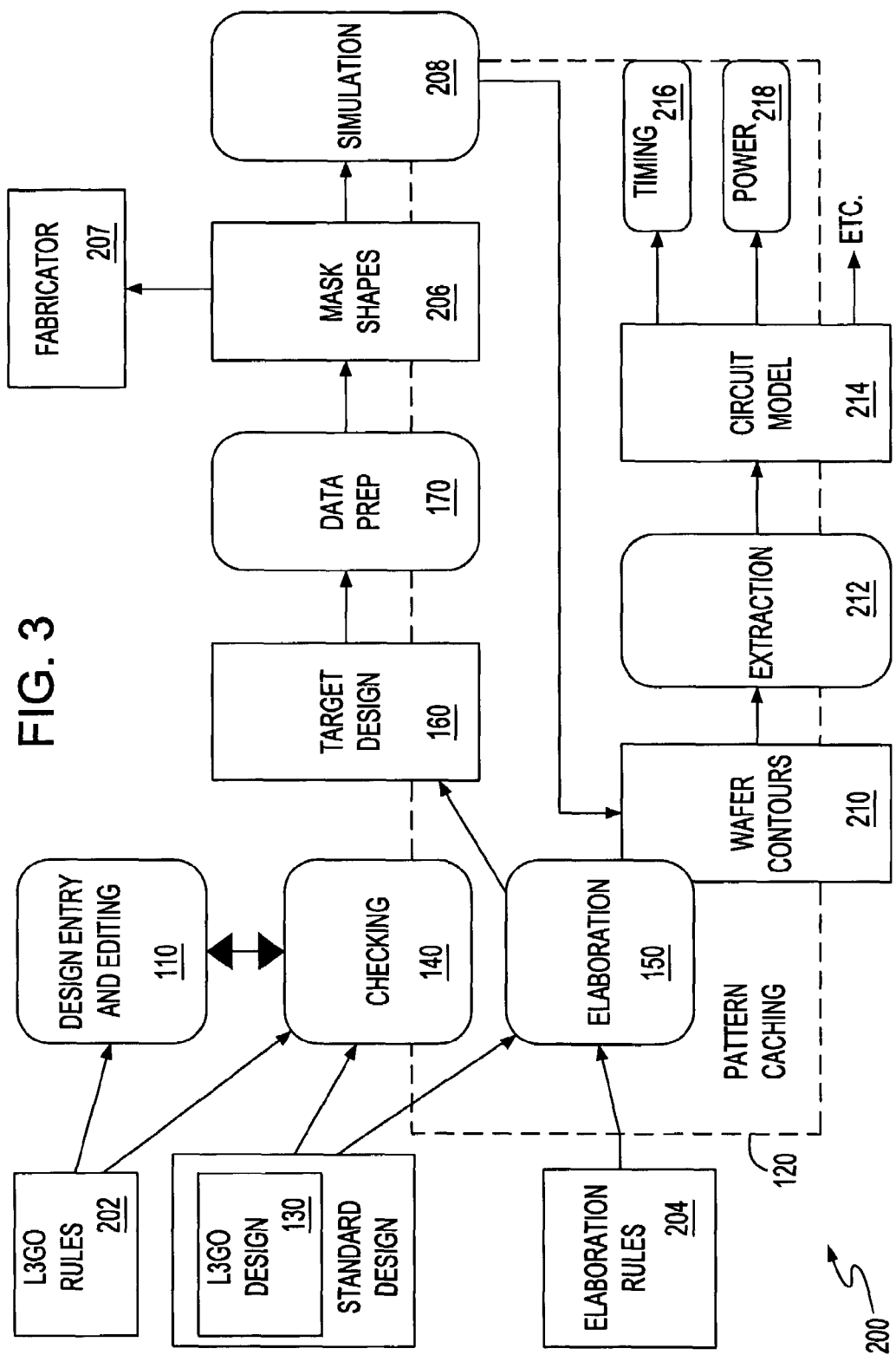
FIG. 3 shows an example in more detail of L3GO design and fabrication dataflow.

FIG. 3 shows an example in more detail of L3GO design and fabrication dataflow 200 according to a preferred embodiment of the present invention with reference to the example of physical design flow 100 of FIG. 1 with identical features labeled identically. Layout creation or design entry and editing 110 may be, e.g., interactive through a graphical user interface (GUI) at any state of the art workstation, computer terminal, personal computer, or the like running a suitable design tool, guided by L3GO design rules 202. Preferably, the design tool includes an application extension of a standard state of the art layout tool, e.g., an extension written in the SKILL programming language derived from LISP and written for the Cadence Virtuoso™ layout editor. The L3GO layout 130 is checked 140 interactively against the L3GO design rules 202 as the LG3O layout 130 is generated. Once entry and editing is complete, the final L3GO layout 130 is checked 140 and sent to elaboration 150. Elaboration rules 204 are applied to the L3GO layout 130 to generate the target design 160. Preferably, the target design 160 is provided in an industry standard format as geometric information, attributes and/or properties, e.g., OpenAccess, or in a data interchange format such as GDSII or OASIS. The target design 160 is passed to data prep 170. Data prep 170 uses mask creation data to convert target design shapes into proper mask shapes 206. Primarily, the mask shape data 206 are sent to a fabricator 207 for conversion to photomasks and then used to pattern wafers. Preferably, in addition, the mask shape data 206 passes to a print simulation 208 to generate wafer contours 210 that indicate how the shapes will print. The wafer contours 210 are passed to physical model extraction 212. Preferably, the L3GO layout is maintained in the same format from target design 160 to model extraction 212. Model extraction 212 generates a circuit model 214 for the design from the wafer contours 210. As with any design, the circuit model 214 may verify that the design will print as it should be printed and to insure design integrity, e.g., design timing 216, power 218 and etc. Pattern caching 120 allows an end to end analysis of the particular design from entry 110 to elaboration 150 to data prep 170 to simulation 208 to subsequent analysis 214, 216, 218 and finally to any subsequent analysis.

Primarily, L3GO rules 202 include glyph-specific design rules that restrict the design to L3GO geometry, rules relating glyphs to conventional layout shapes and rules for checking any conventional shapes included in a particular design. So, instead of specifying constraints in terms of complex inequalities involving relative edge placements, the L3GO rules are constraints on individual glyphs and local configurations of glyphs, e.g., a polysilicon gate must be a horizontal stick spanning at least two polysilicon gate grid points and must be separated from other polysilicon gate glyphs by at least two grid spaces. The L3GO rules 202 may be in text files or run sets, such as are used for conventional state of the art design rule checkers. Once defined, the L3GO rules 202 may be converted into internal form by the checking unit 140. Rules that relate glyphs to conventional layout shapes and conventional design rules for conventional shapes may be implemented using rule representations for a conventional shape checker like Mentor Graphics Calibre™, for example.

The elaboration rules 204 define the conversion from L3GO designs into conventional, shape-based target designs 160. Simple rules are applied to single glyphs, e.g., polysilicon gate glyphs may be expanded in a single direction into rectangles with a length that of the glyph length and a width is the critical polysilicon gate level line width. More complex rules may apply to glyphs or parts of glyphs depending upon the particular context. For example, first metal level line-ends may be extended if there is no crossing first metal level glyph within two grid spaces. In another example, dog-bone anchors may be added if first metal level glyphs are not parallel within two grid spaces. Further, more complex rules may be specified for patterns of glyphs, glyph parts, geometric relations, and logical connectives. For example, an elaboration rule may be included for the occurrence of polysilicon gate glyphs and metal level glyphs meeting at a contact point glyph that extends the polysilicon gate shape one grid along the first metal level line and adds a redundant contact shape at the new polysilicon gate shape end.

Preferably, L3GO-specific design components are encoded, using one of two approaches, i.e., either extending the L3GO properties and values to existing data models or, providing new types of design objects. So, according to the first preferred approach, extensibility mechanisms of the Open Access (OA) data model (properties and values) are used to add new object types to OA persistent and in-core storage. These object types are wrapped with C++ classes or SKILL (LISP) data for manipulation. According to the second preferred approach, new types of design objects may be represented as conventional design objects with special interpretations. For example, the grid for a particular layer in a particular cell may be represented by a right triangular shape on that layer in that cell. The base of the right triangular shape is the X pitch, height is the Y pitch, and the perpendicular corner is the grid origin. Point glyphs may be represented by a circle with minimum radius, e.g., 1 database unit. Stick glyphs may be represented by a path or line object with minimum width, e.g., a line that is 2 database units wide, one on either side of the line. Rectangle glyphs may be represented directly as conventional rectangular shapes with vertices on grid points or coordinates. The particular approach selected depends upon the capabilities of the particular design tool used for L3GO design entry and editing 110.

Figure 4:
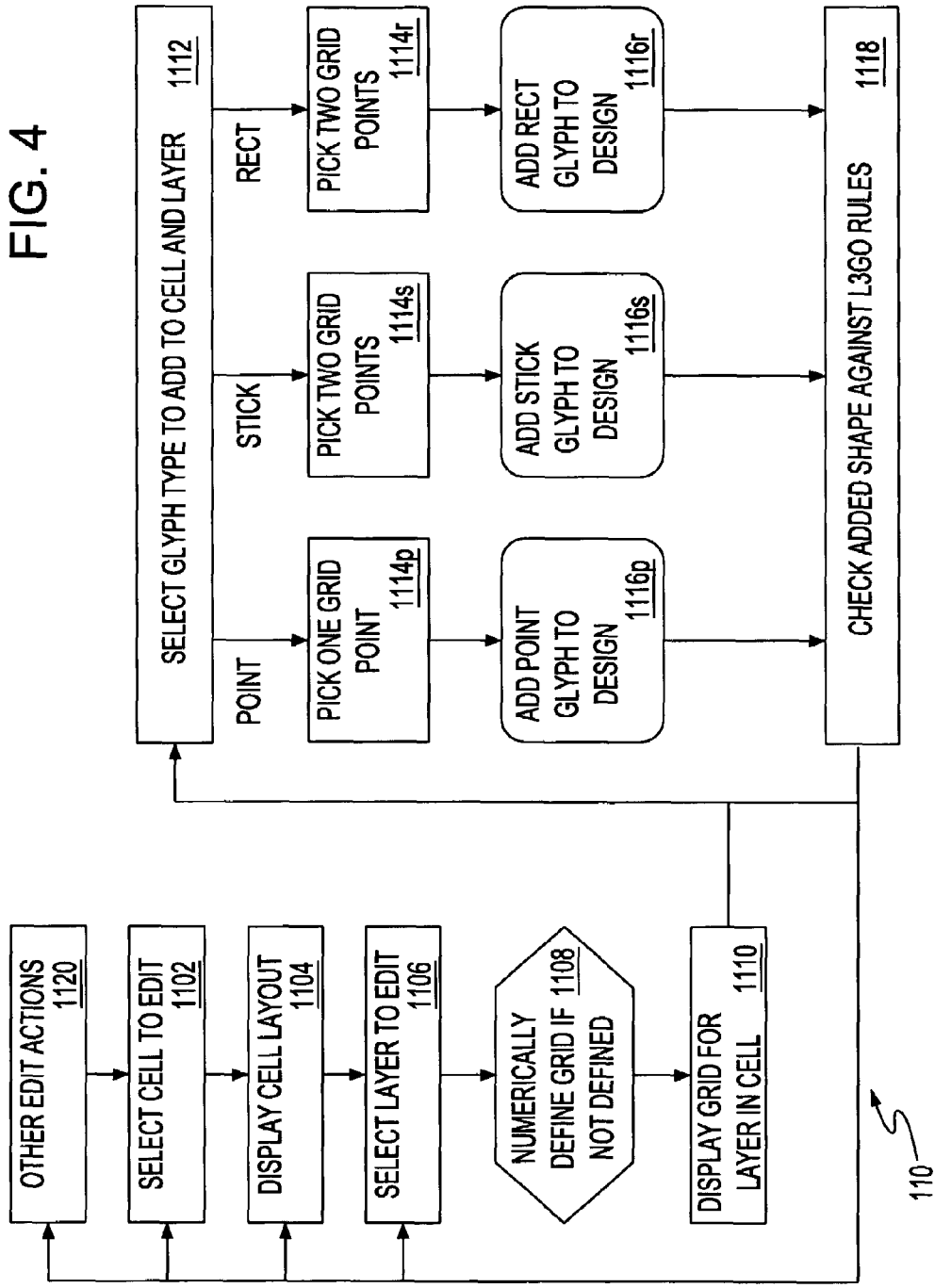
FIG. 4 shows a flow diagram example of design entry and editing and, in particular, adding glyphs.

FIG. 4 shows a flow diagram example of design entry and editing 110 and, in particular, adding glyphs. Editing 110 is typically done interactively, e.g., at a suitably equipped workstation, computer terminal or PC. Design editing begins with selecting a cell 1120 which is displayed 1104 and, then, selecting a layer 1106 in the cell. In step 1108, the grid is defined for the selected layer, if it has not been previously defined. In step 1110 the newly defined or previously defined grid is displayed. A glyph type is selected for adding in step 1112. If point glyphs are selected, then in step 1114$p$ a grid point is selected. Similarly, if stick types are selected, two points are selected in step 1114$s$ to define the stick glyph and/or, if rectangle glyphs have been selected, then two points indicating opposing vertices are selected in 1114$r$. Next, in step 1116$p$ (or 1116$s$ or 1116$r$) the point (stick or rectangle) glyph is added to the design and in step 1118, the cell/layer is checked against L3GO rules 204. If added the glyph fails the rules check 1118, it is removed. Then, the designer is returned to glyph type selection 1112 and allowed to select another point glyph 1114$p$, stick glyph 1114$s$ or rectangle glyph 1114$r$. Otherwise, if the glyph complies with L3GO rules checking in 1118, more glyphs may be added to the same layer in 1112 or, the designer can select another layer for editing in 1106 or, the designer may select a different cell in 1104. In addition, the designer may select other editing actions 1120, including moving, modifying or deleting glyphs. Once the designer has completed entering and editing design data in step 110, the L3GO design is sent to checking 140.

Pattern caching 120 allows an end to end processing of the particular design from entry 110 to elaboration 150 to data prep 170 to simulation 208 to subsequent analysis 214, 216, 218 and finally to subsequent analysis, which would check for defect-limited and circuit-limited yield programs. The added expense for complete end to end chip processing is reduced because L3GO chip layouts may be a restricted set of glyphs on a restricted grid. Thus, L3GO-generated layouts may be decomposed into a finite (albeit typically large) local configuration set. Advantageously, pattern caching 120 provides a general mechanism that may be done in the background of any sequence of steps that start with the L3GO design.

Essentially, pattern caching 120 combines a L3GO conversion cache of previously encountered local configurations with pattern matching with the cached patterns and subsequent identical local configurations. So, pattern caching 120 determine whether a particular configuration has been encountered before for each local L3GO design flow/dataflow (e.g., 100 in FIG. 1, 200 in FIG. 3) neighborhood operation, e.g., elaboration 150, elaboration 150 and data prep 170, elaboration 150 with data prep 170 and simulation 208, and etc. Thus, the L3GO layout for any design continues normally until and unless pattern caching recognizes a previously encountered cached pattern. If pattern caching 120 recognizes a cached pattern, instead of passing through the entire design flow 100, the result for the cached pattern is retrieved, stitched into the flow and the corresponding neighborhood is bypassed. Otherwise, pattern caching 120 identifies and caches any previously unencountered patterns are identified, suitably trimmed and indexed by the local pattern. Depending on the frequency of repetition and length of different patterns, the cache, optionally accompanied by simple use-count statistics, may be relatively small. Thus, generally, the form that pattern caching takes depend upon the particular tool(s) used in the L3GO dataflow.

Figure 5:
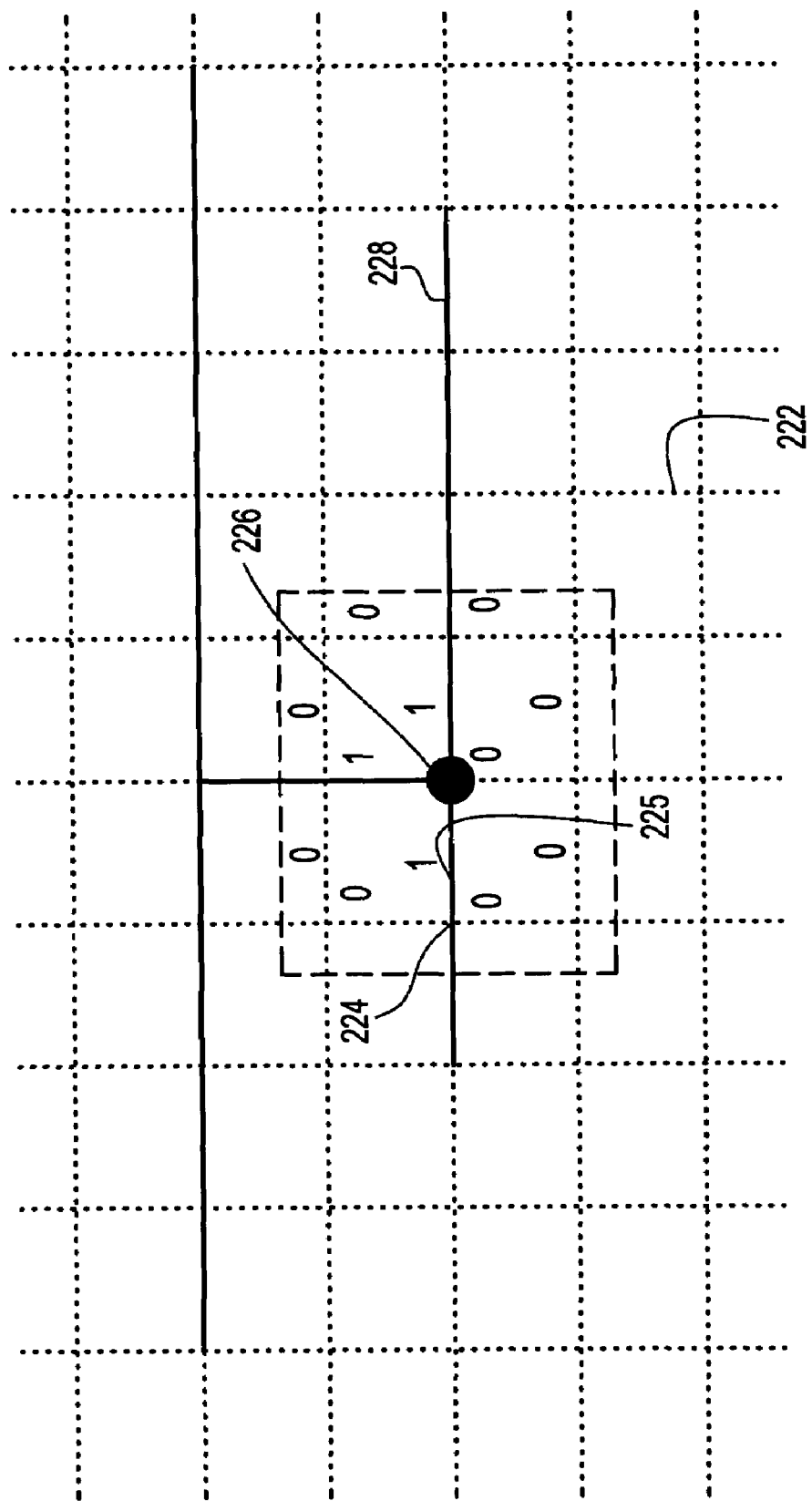
FIG. 5 shows an example of a representation of glyph patterns in a local area attributed for pattern caching.

FIG. 5 shows an example of a representation of glyph patterns in a local area 220 attributed for pattern caching 120. In this example, the local configuration and pattern matching is based on the underlying L3GO grid 222. Each grid edge, e.g., 225, spans between adjacent grid points, e.g., 224 and 226. Occupancy attributes (e.g., a 1 or a 0) are attached to relevant edges and indicate whether the edge is occupied by a part of a L3GO stick glyph 228, e.g., on the polysilicon gate layer. Once the occupancy attributes are attached, the grid point 226 can be labeled with a twelve bit word, each of bits corresponding to one of the edges within the region-of-interest (ROI). Pattern caching 120 may be done in two separate passes through a particular neighborhood, matching pass followed by a substitution pass. In the first pass through the neighborhood, one instance is identified for each unique local configuration in the design. In the second pass through the neighborhood, the actual processing steps are applied to the first pass results to generate an output, e.g., elaboration and data prep produce a mask layout.

Figure 6A:
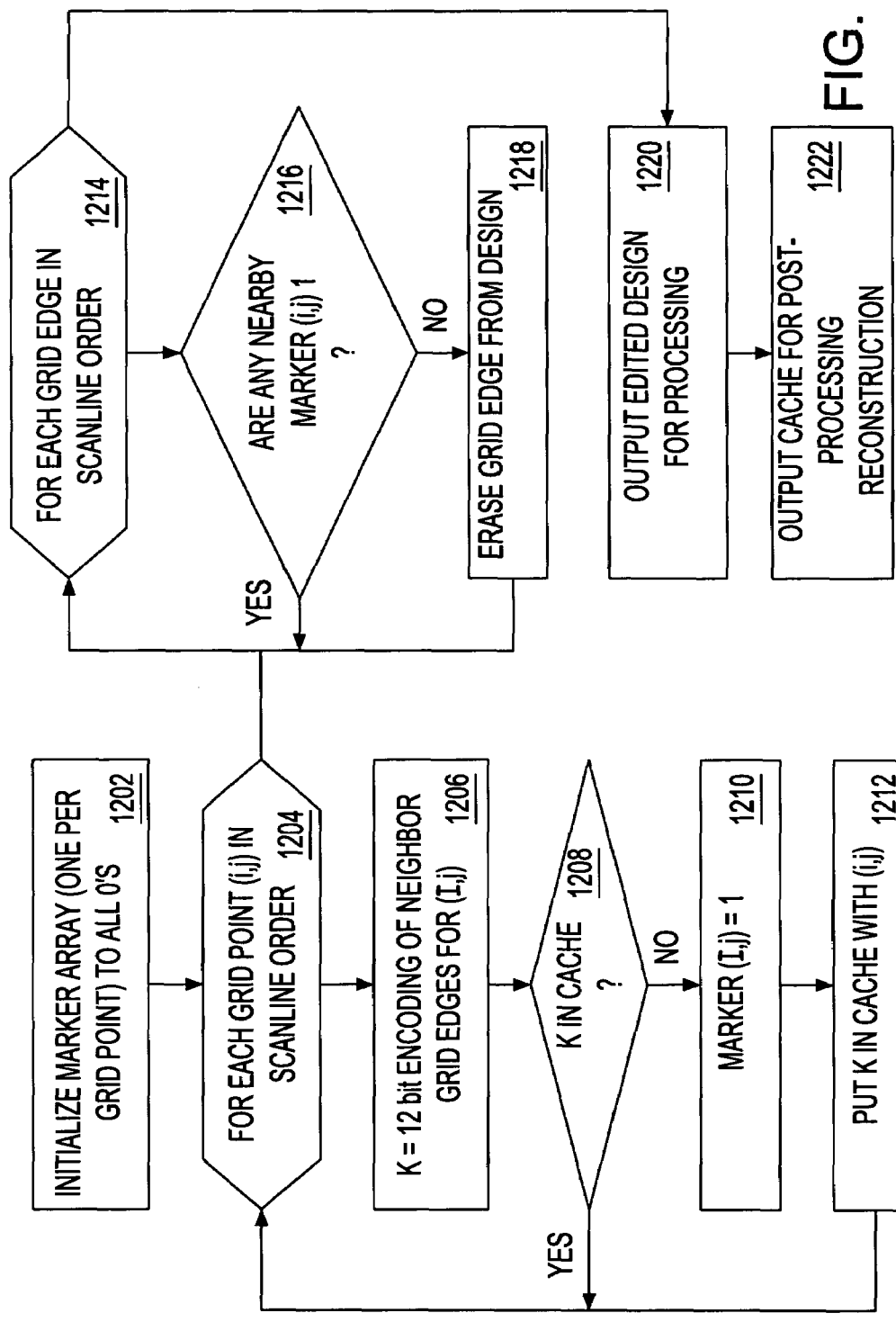
FIGS. 6A-B, show an example of pattern caching in two passes for a neighborhood that is a single conversion unit, e.g., elaboration unit.
Figure 6B:
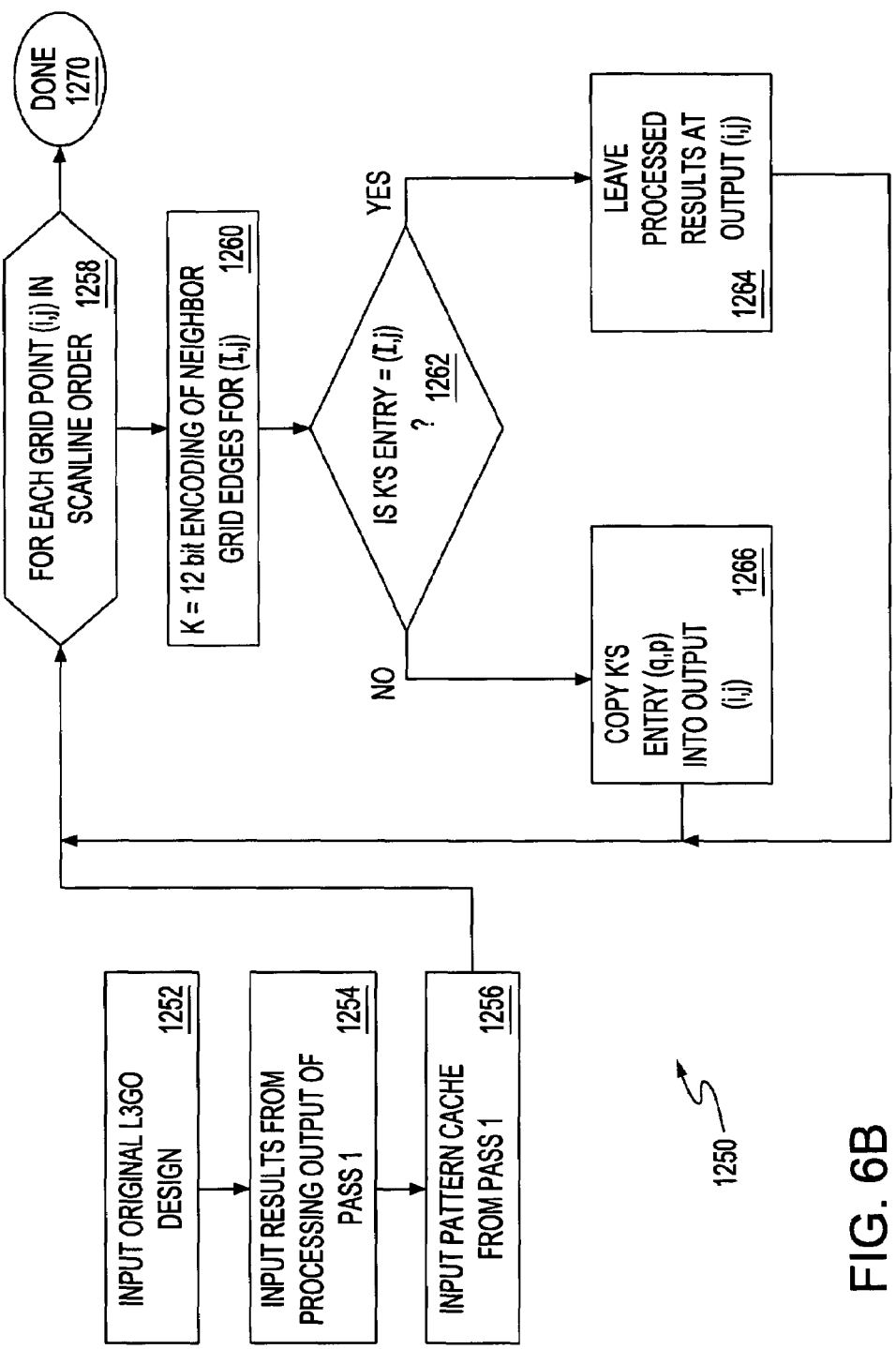

FIGS. 6A-B, show an example of pattern caching in two passes 1200, 1250, according to a preferred embodiment of the present invention, for a neighborhood that is a single conversion unit (e.g., elaboration unit 130) in this example. The first pass 1200 in FIG. 6A begins in step 1202 by initializing a grid marker array with a corresponding entry for each grid point, e.g., resetting each entry to zero. Then, in step 1204 a first grid point is selected from the array, e.g., 226 in FIG. 5. In step 1206, occupancy attributes are assigned to the 12 surrounding edges and the selected grid point is labeled with those attributes, e.g., as a 12 bit pattern word, K. Next in step 1208, the current pattern word is compared with cached patterns to determine whether the current pattern word has been previously encountered, i.e., the word for the current pattern matches a cached word. If the current pattern word matches, then, the match is the result of current bit pattern encoding the particular neighborhood. So, returning to step 1204, the next grid point is selected, preferably in scanline order. Again, in step 1206 occupancy attributes are assigned to any previously unassigned entries and in step 1208 cached patterns are checked for the pattern word. If the pattern word is not found in the pattern cache, in step 1210 the pattern is marked as new and cached in step 1212. Then, returning to step 1204, the next point is selected. This continues until all of the grid points have been considered in step 1204.

Once all of the grid points have been considered, the design data may be reduced to only the marked patterns for the current neighborhood, i.e., only those patterns that did not match any previously in the cache. So, beginning in step 1214 a grid edge is selected and in step 1216 checked for a nearby marker. If none are found, then in step 1218 the selected edge is erased from the design and returning to step 1214, the next edge is selected, again preferably in scanline order. If a marker is found in step 1216, the edge is left untouched and returning to step 1214, the next edge is selected. After all of the edges have been considered in step 1214, the edited design is output in step 1220 and the pattern cache is output in step 1222 for normal treatment in the neighborhood. After outputting the edited design in step 1220 and the cache in step 1222, the marked pattern portions are treated normally as they traverse the neighborhood to emerge, e.g., treated as normal glyphs for elaboration 130 or as normal wafer contours from 208. It should be noted that to reduce and minimize the amount of storage used for the marker array, the grid marking of steps 1202-1212 may be pipelined with design editing steps 1214-1222.

Following the first pass, the edited design resulting from step 220 is the input to the neighborhood, i.e., the specified program(s) with the desired operation(s).

The second pass 1250 in FIG. 6B begins in step 1252 by inputting the original L3GO design. In step 1254 result of processing the edited design by the specified program(s) is retrieved and in step 1256 the pattern cache is retrieved. Then, in step 1258 a grid point is selected from the array. In step 1260 the 12 bit word pattern for the selected grid point is retrieved from the grid marker array. In step 1262, the pattern cache is checked for the pattern K encoding the neighborhood around edge(I,J). If the result entry indicates that edge(I,J) is the first occurrence of K, then in step 1264, this result indicates that the neighborhood around edge(I,J) was part of the actual-processed edited design, and so the output does not change. However, if the cache lookup for K indicates that the first occurrence of K was at some location (P,Q) other than (I,J), then in step 1266 that output around (P,Q) is copied to the output around (I,J). Otherwise, if the selected word pattern matches a cached pattern, the cached pattern result is inserted in the result. Once the appropriate pattern result has been inserted, if necessary, into the output in step 1268, the next grid point is selected in step 1258, preferably in scanline order. After all of the grid points have been selected in step 1258, the design exits the second pass in step 1270. It should be noted that as shown and described in this example for a single unit neighborhood, the two pattern caching steps 1200, 1250 can be further combined with any of a number of hierarchical shape-processing mechanisms, e.g., Niagara. See, e.g., Russell et al., supra. Thus, the presence of these repetitive patterns in such a hierarchical design minimizes encoding so that the flat design can be encoded as a minimal set of flat designs for all unique repetitive pattern combinations, i.e., essentially, pattern caching at a higher structure level.

Figure 7:
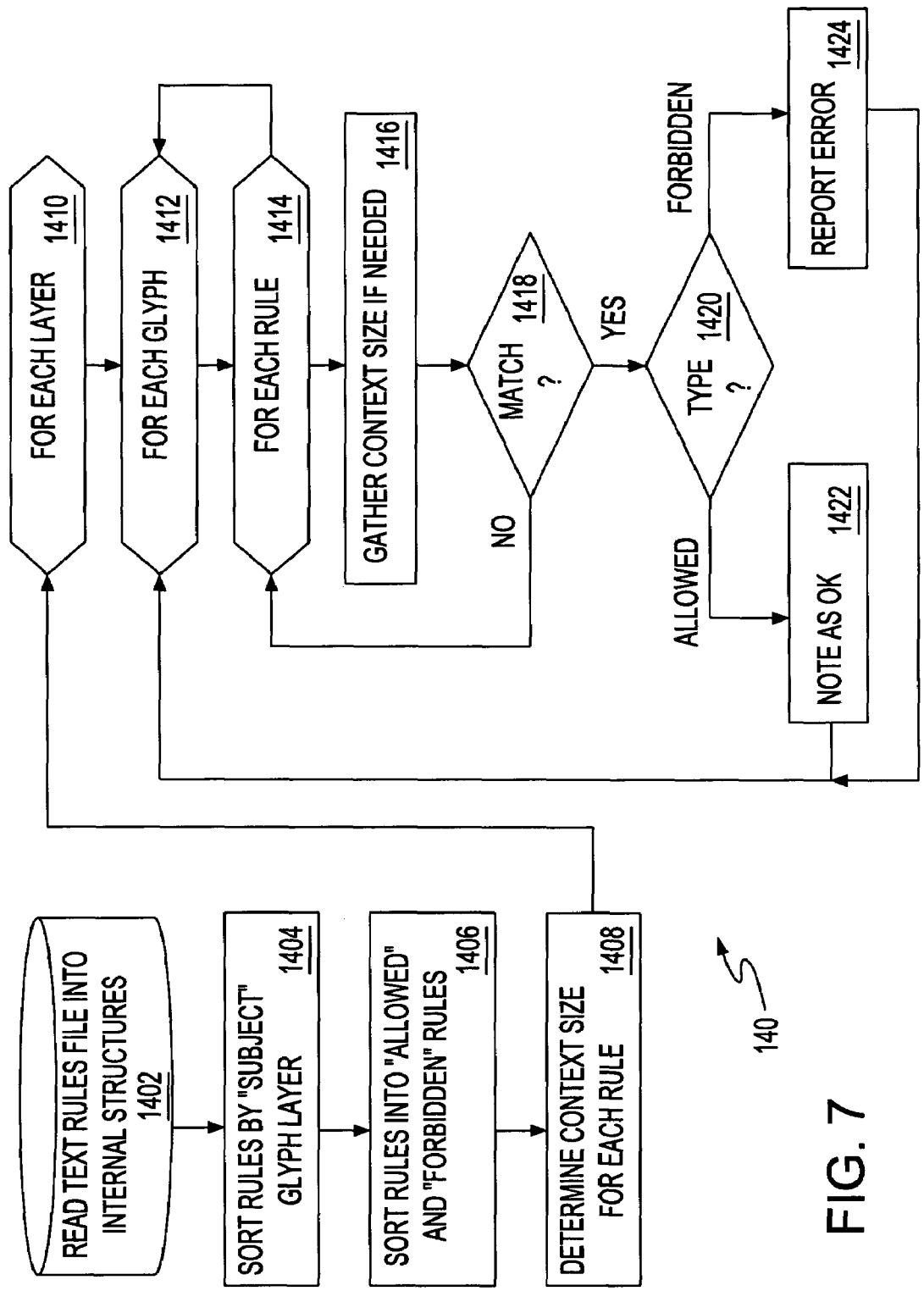
FIG. 7 shows a flow diagram example of checking L3GO specific parts of a L3GO layout (i.e., the glyphs) for compliance against L3GO rules.

FIG. 7 shows a flow diagram example of checking 140 L3GO specific parts of a L3GO design (i.e., the glyphs) for compliance against L3GO rules (e.g., 202 of FIG. 3) according to a preferred embodiment of the present invention. Checking 140 matches design glyph patterns and, optionally, nearby context glyphs against the pattern part of each rule. Thus, problems with arithmetic robustness are avoided and checking efficiency may be improved using various algorithmic search structures and hashing methods. So, beginning in step 1402 L3GO rules 202 are retrieved for the selected technology, e.g., from storage. In step 1404, the L3GO rules 202 are sorted by glyph layer. In step 1406 the rules are further sorted to differentiate between violative and discretionary rules. Discretionary rules specify local patterns that are allowed notwithstanding other rules. In step 1408 a context size is determined for each rule, i.e., the distance beyond a given glyph that the layout must be examined to detect violating or supporting other glyphs. First, in step 1410 a layer of the design is selected for checking. Next in step 1412, an individual glyph on that layer is selected. Then, in step 1414 a first one of the rules is selected and in step 1416 the context to surrounding glyphs and any other traditional shapes in the immediate proximity of the selected glyph may be gathered for the selected glyph. In step 1418 the selected glyph is checked against the selected rule to determine if the rule applies to the selected glyph and its context. If not, returning to step 1414 the next rule is selected. Whenever a particular rule is found to have matched the selected glyph and its context in step 1418, then in step 1420, the rule is checked to determine if it is a violative or discretionary rule. If it is a violative rule, an error is reported in step 1422 and, returning to step 1412 another glyph is selected. If it is a discretionary rule, then the selected glyph in its context is considered valid in step 1412 and the checking can proceed to the next glyph in step 1414.

Once glyphs have been checked, conventional design shapes and their interactions in a L3GO design glyphs may be done using any suitable conventional design rules checking (DRC) tool. Conventional shapes may be checked against L3GO design glyphs on a conventional DRC tool by treating the L3GO shapes as line-like or point-like conventional shapes. Alternately, L3GO-compliant representations may be provided for the conventional shapes (e.g., least enclosing rectangles snapped outward to the appropriate grid for the design level) and, then the representations of the conventional shapes are checked against L3GO shapes using L3GO-specific checking mechanisms. Preferably, the checking unit 140 is a subunit of L3GO entry/editing unit 120 for seamless correct by construction layout generation, e.g., the designer cannot enter a glyph that violates non-discretionary or violative rules. Optionally, however, the checking unit 140 may operate as a separate unit. Once the L3GO layout has been checked, it is passed to elaboration in the elaboration unit 150.

Figure 8:
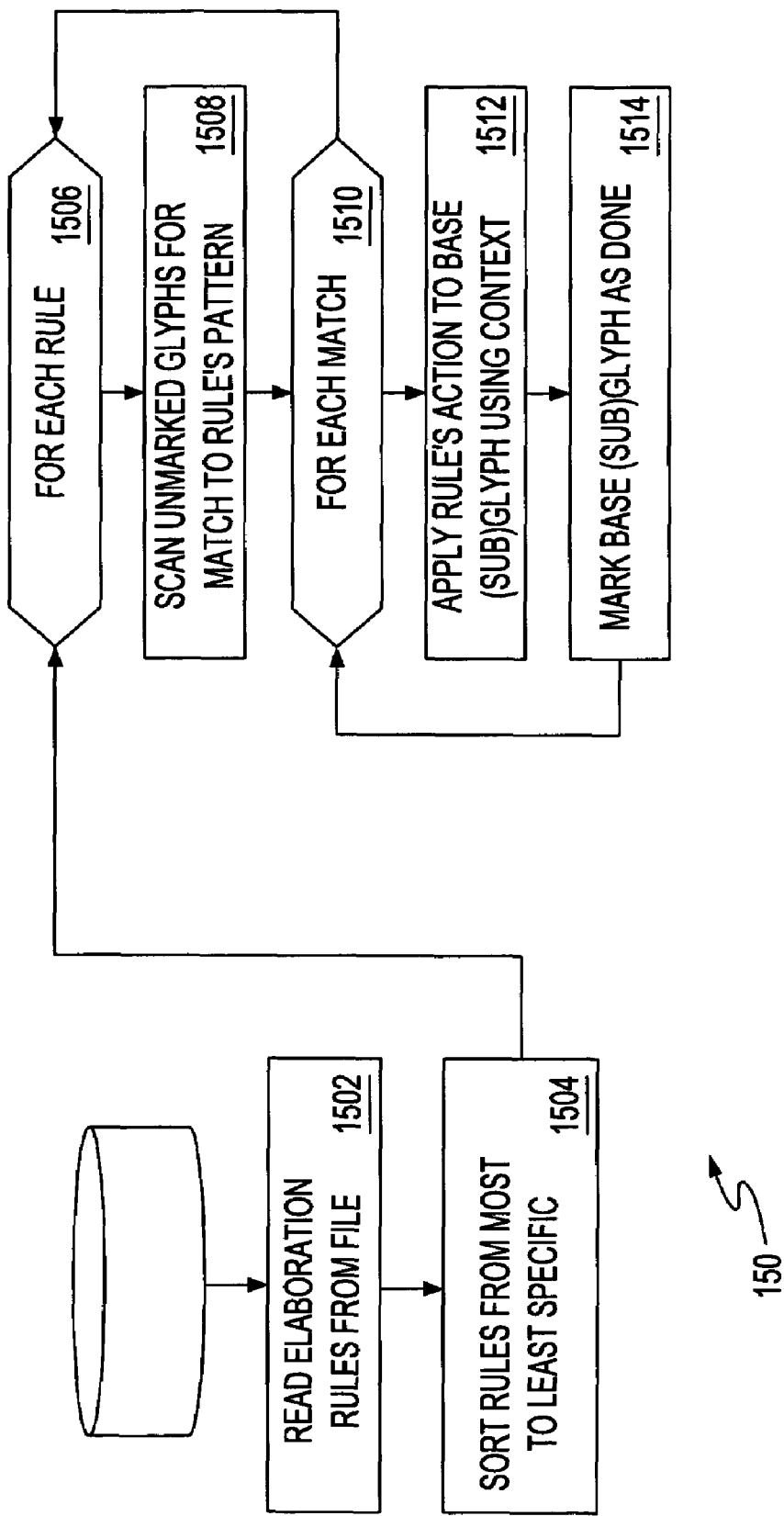
FIG. 8 shows a flow diagram example of elaboration of a L3GO layout in the elaboration unit, i.e., converting the glyph-based geometry into conventional geometry.

FIG. 8 shows a flow diagram example of elaboration of a L3GO design in the elaboration unit 150, i.e., converting the glyph-based geometry into conventional geometry according to a preferred embodiment of the present invention. This may be as simple as fleshing-out stick glyphs into rectangles and point glyphs into squares, or it may involve more complex, context-dependent geometric processing, e.g. expanding a polysilicon border around a contact glyph. First in step 1502 the elaboration rules (e.g., 204 in FIG. 3) are retrieved for the selected technology, e.g., the elaboration rules 204 may be a text file in remote storage. Generally, each of the elaboration rules 202 includes a pattern and an associated action. A typical pattern may include a base, i.e., a glyph or part of a glyph (e.g., part of a stick glyph including one of its endpoints) and a context, i.e., a set of glyphs or glyph parts that must be present in order for the pattern to match. Next, in step 1504 the elaboration rules are sorted by the specificity of the pattern, from most to least specific. A specific rule, for example, may require that: ends of polysilicon gate stick glyphs be extended at least three grid spaces long and coincident with perpendicular first metal level stick glyphs, at least four grid spaces long with a coincident contact level glyphs. By contrast, a least specific rule, for example may designate treatment of diffusion layer rectangular glyphs. In step 1506 the most specific rules is selected. In step 1508 the design is scanned from most to least specific using, for example, a pattern matching algorithm to identify instances of patterns, until in step 1510, an instance of a pattern is found. A corresponding action is invoked in step 1512 for each match and the structure matching the pattern (possibly with free variables) is elaborated. The elaborated shape is output as part of the target design 160 and, in step 1514 the matching glyph or subglyph corresponding the base part of the pattern is marked as done.

Primarily, the target design 160 is compatible with conventional designs and flows seamlessly into well known state of the art downstream analysis and data prep. Preferably, elaboration 150 adds geometric intent information as an extension to conventional design information. The geometric intent information specifies tolerances and/or general constraints on individual shapes or parts of shapes, e.g., a maximum corner rounding radius for an inside corner of diffusion level shapes near a gate level shapes or, the tolerance on the specified gate level width variations. Elaboration 150, for example, can add geometric intent information translated from higher-level designer intent information, e.g., marking a polysilicon gate level shape forming a gate shape as non-critical may result in a looser tolerance and increased nominal line width in the corresponding conventional target design shape. Also, preferably, the geometric intent information is provided as industry standard attributes and/or properties or in a data interchange format. By using these industry standard attributes or data interchange format, design intent that applies to whole shapes may be specified directly, e.g., it may be easier to determine which parts of a polysilicon gate level shape form the gate and which parts are poly interconnects. Additionally, design intent can be encoded for parts of shapes, e.g., a geometric tolerance on a particular edge of a shape may be represented as a numeric tolerance attached to the edge, either by the serial order of the shape edges or geometrically, e.g., by defining endpoints.

Data prep 170 derives mask shapes from target shapes and design intent information. For any patterns not handled by pattern caching 120, a collection of shape-transformation applications are applied to the target shapes to compensate for various aspects of the target technology processes and materials. In one preferred embodiment, industry-standard software tools, such as Mentor Calibre, implement suitable well known data prep techniques, e.g., alternating phase shift mask generation and optical proximity correction. Geometric information is attached to the prepared target shapes sufficient to build mask shapes 206, again as industry standard attributes and/or properties or in a standard data interchange format. Preferably, the mask shape 206 geometric information includes mask intent information, similar to the geometric intent information for target shapes. The mask intent information reduces the time and cost of mask-building because a lower precision is required for mask-writing and inspection.

The simulation 208 predicts how the physical structures finally print on wafers (as wafer contours 210) that are manufactured in a specified process. Typically for simulation 208, previously simulated cached patterns are retrieved or new simulations are created using, preferably, the same industry standard software tools. The simulation 208 predicts the nominal wafer shapes precisely and, also, the variation of those shapes including correlation to underlying systematic effects variables, e.g., through-dose, through-focus variations, etc. The wafer contours 210 are geometric shapes that represent the expected final fabricated material shapes, e.g., using standard design representations or data interchange formats, augmented with properties that may be bound to individual shapes or to entire layers. Typical such augmented properties indicate each wafer contour shape's correspondence to process variable conditions. Preferably, this variational information is maintained explicitly rather than lumped together, for example, into nominal contours and tolerance information. Thus, detailed correlation among the variations is available to downstream analysis programs.

Extraction 212 and Circuit Models 214 include application of a number of well known analysis processes to convert the wafer contours 210 (with their variations) into meaningful electrical parameters for consideration by the layout designer or in the layout-generating program, e.g., switching time, power dissipation 218, defect and noise sensitivity and etc. In particular, extraction provides a circuit model representation that depends on the particular parameter(s) being derived, e.g., device switching time and interconnect propagation time 216. For example, device switching time and interconnect propagation time 216 may be computed using an industry-standard extraction software tool, such as AssuraRCX™. Also, for other properties such as vertical interconnect defect sensitivity, ad hoc applications based on industry-standard shape-processing software tools could be used.

Advantageously, L3GO design rules may be expressed as a very simple set of allowed and disallowed patterns of grids and glyphs, omitting any details about functions used to check the rules. L3GO layouts may be created by conventional design tools by suitably representing glyphs using conventional shapes, e.g., narrow paths (e.g., sub-minimum lines) for sticks and small (e.g., sub-minimum) squares for points. Further, most layout editors provide for customizing layout editing environments to simplify the entry of L3GO layouts. For example, editing may be customized to allow entering sticks and points directly rather than using conventional shape approximations. Also, the layout editing environment may be selected to enforce proper glyph alignment with the layout grid. Optionally, pattern-based design rule checking may be integrated into the layout editing environment for correct by construction layouts, thereby eliminating separate checking steps. In addition, in much the same way that gridded routing automatically generates interconnect layouts from schematic netlists, L3GO layouts may be generated directly from schematic representations because L3GO layouts are highly constrained by glyphs and coarse grids. As a result, it is not necessary to represent small geometric details that might otherwise obscure design intent because properties attached to glyphs convey that intent with respect to devices and connections.

Additionally, unlike typical state of the art technology based design systems, L3GO designs mitigate the cost of migrating from one technology to the next. L3GO rules are insensitive to small process changes, as are the grid and stick level of representation for many designs. Most minor process changes do not require any corresponding L3GO rule changes and can be relegated to elaboration and subsequent automatic process steps. In fact, some L3GO layouts may be completely technology independent, because the L3GO grid and stick representation seamlessly transfers from one technology to the next without any design changes. Any physical changes to the design from migrating between technologies may be effected in elaboration process and data prep. Simulation can be updated simply by using new process models.

Also, pattern caching efficiently processes very detailed L3GO layouts through process simulation and analysis with the design detail level contributing to the precision of the resulting models. Pattern caching dramatically reduces data prep execution time for L3GO layouts, as well as for other computation intensive steps, because computation for any pattern may only be done once, while the result of the computation is used repeatedly for repeated patterns. This also reduces the output data volume and makes subsequent computation (e.g., mask fracturing) more efficient as well. L3GO designs significantly reduce the unpleasant surprises normally inherent in large designs because the number of distinct layouts (i.e., the design space) is greatly reduced. With sufficient design space reduction, every local layout configuration may be examined to find and eliminate surprises, at least for the L3GO portions of the particular design.

While the invention has been described in terms of preferred embodiments, those skilled in the art will recognize that the invention can be practiced with modification within the spirit and scope of the appended claims.

What is claimed is:

1. A design system comprising:
   an interactive design unit interactively receiving a circuit design and providing an integrated circuit (IC) design, said interactive design unit comprising:
      means for selecting said cell layout for editing,
      means for locating a selected said cell layout in a gridded environment, and
      means for adding glyphs to said selected cell layout;
   a layout unit receiving a circuit description of said IC design, said layout unit representing portions of said IC design in a grid and glyph format, wherein glyphs in said grid and glyph format include point glyphs, line glyphs and rectangle glyphs;
   a checking unit checking grid and glyph portions;
   an elaboration unit generating a target layout from each checked one of said grid and glyph portions;
   a data prep unit preparing said target layout for mask making;
   a pattern caching unit selectively substituting previously cached results for ones of said grid and glyph portions;
   a mask shape generation unit generating mask shapes from a prepared said target layout;
   a simulation unit generating wafer contours from generated said mask shapes;
   an extraction unit extracting circuit models from generated said wafer contours; and
   a modeling unit generating expected IC electrical parameters from said circuit models.

2. A design system as in claim 1, wherein said checking unit comprises:
   a rules storage storing grid and glyph design rules;
   a sorter sorting said grid and glyph design rules;
   glyph selection means for selecting a glyph for checking;
   a rules checker comparing a selected said glyph for compliance with a selected one of said grid and glyph design rules; and
   means for indicating comparison results.

3. A design system as in claim 2, wherein said checking means comprises:
   means for selecting a design layer;
   means for selecting a glyph on said selected design layer;
   means for selecting one of said grid and glyph design rules for checking.

4. A design system as in claim 2, wherein said means for indicating comparison results provides an error indication responsive to a violation of selected ones of said grid and glyph design rules.

5. A design system as in claim 4, wherein said selected ones are violative rules, said error indication not being provided for violations of discretionary rules.

6. A design system as in claim 2, wherein stored said grid and glyph design rules include rules governing glyph interaction with design shapes and said checking unit further comprises:
   context determining means for determining a context size for each said grid and glyph design rule and for identifying surrounding design shapes; and
   context gathering means for gathering said context size for said selected glyph.

7. A design system as in claim 6, wherein said checking means checks gathered said context against said rules governing glyph interaction with design shapes.

8. A design system as in claim 1, wherein said elaboration unit comprises:
   a rules storage storing elaboration rules;
   a rules sorter sorting said elaboration rules;
   a rules checker checking whether a glyph matches any of said elaboration rules; and
   means for expanding glyphs responsive to a matched one of said elaboration rules.

9. A design system as in claim 8, wherein said sorter sorts said elaboration rules from most specific to least specific.

10. A design system as in claim 8, said elaboration unit further comprising glyph marking means for marking each expanded said glyph and expanded glyph parts as done.

11. A design system as in claim 1, wherein said pattern caching unit comprises;
   a pattern storage storing results of previously processed patterns;
   a cached pattern recognition unit identifying design patterns in said IC design as corresponding to ones of said previously processed patterns; and
   means for substituting stored said results for identified said design patterns.

12. A design system as in claim 11, wherein said cached pattern recognition means comprises;
   pattern scanning means for scanning areas around each glyph in said IC design for a pattern matching one of said previously processed patterns; and
   grid marking means for marking a grid location for each unmatched pattern; and
   design data reduction means for reducing said IC design to unmatched patterns.

13. A design system as in claim 12, wherein said pattern scanning means comprises:
   pattern locating means for scanning each grid point and checking for a pattern at said each grid point;
   encoding means for encoding each located said pattern; and
   pattern matching means for comparing each encoded said pattern for a match with said previously processed patterns.

14. A design system as in claim 13, wherein said pattern caching unit further comprises;
   edge selection means for determining whether each grid edge is in close proximity to an unmatched pattern; and
   means for selectively removing grid edges responsive to said edge selection means.

15. A design system as in claim 1, wherein said means for selecting a cell layout for editing comprises;
   means for selecting said cell layout;
   means for displaying said selected cell layout; and
   means for selecting a layer in said selected cell layout.

16. A design system as in claim 1, wherein said means for adding glyphs comprises:
   means for selecting a glyph type; and
   means for selecting grid points, a glyph of said selected type being added at selected said grid points.

17. A design system as in claim 1, said interactive design unit further comprising;
   a rules storage storing glyph behavioral rules; and
   a rules checker checking each added glyph for compliance with said glyph behavioral rules.

18. A design system as in claim 1, said pattern caching unit further monitoring said IC traversing said mask shape generation unit, said simulation unit, said extraction unit and said modeling unit.

* * * * *